United States Patent
Busking et al.

(10) Patent No.: US 7,961,049 B2
(45) Date of Patent: Jun. 14, 2011

(54) AMPLIFIER WITH COMPENSATED GATE BIAS

(75) Inventors: Erik Bert Busking, Den Haag (NL); Andries Peter De Hek, Hardinxveld Giessendam (NL)

(73) Assignee: Nederlandse Organisatie voor toegepast-natuurwetenschappelijk onderzoek TNO, Delft (NL)

( * ) Notice: Subject to any disclaimer, the term of this patent is extended or adjusted under 35 U.S.C. 154(b) by 1 day.

(21) Appl. No.: 12/095,731

(22) PCT Filed: Dec. 4, 2006

(86) PCT No.: PCT/NL2006/000608
§ 371 (c)(1),
(2), (4) Date: Aug. 5, 2009

(87) PCT Pub. No.: WO2007/064201
PCT Pub. Date: Jun. 7, 2007

(65) Prior Publication Data
US 2010/0066453 A1 Mar. 18, 2010

(30) Foreign Application Priority Data
Dec. 2, 2005 (EP) .................................... 05077761

(51) Int. Cl.
*H03F 3/04* (2006.01)
(52) U.S. Cl. ........................................ 330/296; 330/289
(58) Field of Classification Search .................. 330/285, 330/296, 289
See application file for complete search history.

(56) References Cited

U.S. PATENT DOCUMENTS

| 4,990,973 A | * | 2/1991 | Ishikawa et al. ............... 257/142 |
| 5,506,544 A | | 4/1996 | Staudinger et al. |
| 5,808,515 A | | 9/1998 | Tsuruoka et al. |

FOREIGN PATENT DOCUMENTS

| EP | 1 562 284 A | 8/2005 |
| JP | 2000 124749 A | 4/2000 |

OTHER PUBLICATIONS

Yamanaka et al. "Ku-ban Low Noise MMIC Amplifier With Bias Circuit for Compensation of Temperature Dependence and Process Variation" IEE MTT-S International Microwave Symposium Digest, (IMS 2002) vol. 3 of 3 pp. 1427-1430, Jun. 2, 2002.
International Search Report for PCT/NL2006/000508 dated Mar. 13, 2007.

* cited by examiner

*Primary Examiner* — Steven J Mottola
(74) *Attorney, Agent, or Firm* — Leydig, Voit & Mayer, Ltd

(57) ABSTRACT

An amplifier circuit includes an amplifier stage (10) having an amplifier transistor (104) with a gate coupled to an input (100) of the amplifier stage, a source coupled to a reference connection (gnd) and a drain coupled to a positive power supply connection (V+). The amplifier circuit includes a bias stage (12) having a bias transistor (120), a drain resistance (124) and a source resistance (122). The bias transistor includes a gate coupled to a negative power supply connection (V−), a source coupled to the negative power supply connection (V−) via the source resistance and a drain coupled to the reference connection via the drain resistance and to the gate of the amplifier transistor. The bias stage includes a further resistance (20, 22) coupled from a node between the source of the bias transistor and the source resistance of the bias transistor to a circuit node that carries a voltage higher than the voltage at the negative power supply connection.

7 Claims, 3 Drawing Sheets

AMPLIFIER WITH COMPENSATED GATE BIAS

FIELD OF THE INVENTION

The invention relates to a transistor amplifier circuit.

BACKGROUND

The abstract of Japanese Patent application laid open No. 2000-124749 discloses an amplifier circuit that includes a gate bias stage for supplying a gate voltage to an amplifying transistor.

FIG. 1 schematically shows the prior art amplifier circuit. The amplifier circuit comprises an amplifier stage 10 and a bias stage 12. The amplifier stage serves to amplify high frequency signals, for example in the Gigahertz range. Typically, this requires various high frequency coupling and blocking elements etc. However, as the invention is mainly concerned with biasing, these have been omitted from the figures for the sake of clarity.

The amplifier stage has an input 100, which is coupled to the gate of an amplifier transistor 104 via a coupling capacitor 102. The drain of amplifier transistor 104 is coupled to a positive power supply connection V+ via a load circuit 108. The drain also forms the output 106 of the amplifier circuit.

For achieving of high frequency stability and gain the source of the amplifier transistor 104 is coupled directly to a ground power supply connection (gnd). This means that a careful control of the bias voltage (average DC voltage) at its gate is required to ensure required amplification properties. Relatively small errors in the bias voltage can have substantial effects on amplification. Amplifier transistor 104 is of the "normally on" type (depletion type), which is in a conductive state its gate-source voltage is zero. Hence, a negative bias voltage (outside the range of the drain-source voltages on the same side of that range as the source voltage) is required.

The bias stage 12 is provided to feed the DC bias voltage to the gate of the amplifier transistor 104. Because amplifier transistor 104 is of the normally on type, a negative power supply connection V− is needed for the bias stage 12, to produce a bias voltage below ground voltage. The bias stage 12 comprises a bias transistor 120 with a gate coupled to the negative power supply connection V−, a source coupled to the negative power supply connection V− via a source resistor 122 and a drain coupled to ground (gnd) via a drain resistor 124. The drain of bias transistor 120 is coupled to the gate of amplifier transistor 104 via a high frequency blocking circuit 126 (e.g. a resistor).

Current through bias transistor 120 causes a voltage drop across drain resistor 124, which defines the bias voltage for amplifier transistor 104. The bias stage 12 of the prior art amplifier circuit is designed to compensate for threshold voltage deviations of amplifier transistor 104. Such deviations can be the result of temperature fluctuations or (to a lesser extent) of manufacturing spread for example. The idea is to use a bias transistor 120 that will exhibit the same deviations as amplifier transistor 104 and to arrange bias stage 12 to convert the deviations of the threshold voltage of its bias transistor 120 into a gate voltage for the amplifier transistor 104 so that the difference between that gate voltage and the threshold voltage is independent of the deviations.

A threshold voltage deviation of bias transistor 120 can be modelled as an opposite change in an input voltage source at the gate of bias transistor 120. The bias stage 12 is arranged to amplify its input voltage change with an amplification gain "g" of minus one, so that the threshold voltage deviation is reproduced at the gate of amplifier transistor 104. The gain "g" of bias stage 12, is determined by (1) the resistance value Rd of drain resistor 124, (2) the transconductance "s" of bias transistor 120 (in the expression Id=s(Vgate−Vsource−Va) for the drain current Id of bias transistor 120 as a function of its gate and source voltage and its threshold voltage Va) and (3) the resistance value Rs of source resistor 122. In an approximation $$g=-Rd/(Rq+1/s)$$

Hence for g=−1 it holds approximately that Rd=Rq+1/s. This ensures that threshold voltage deviations are compensated.

However, for many applications the bias voltage is too negative, when full compensation of threshold voltage fluctuation is achieved, causing amplifier transistor 104 to pinch off. This is because the voltage drop across drain resistor 124 Rd is bigger than the voltage drop across source resistor 122, since Rd>Rs (this in contrast to the response to voltage changes which is equal for the voltages across both resistors). Therefore it is desirable to add a positive offset in the voltage across drain resistor 124. Typically, this involves adding a component between the drain resistor 124 and the positive power supply connection V+. However, it has been found that this introduces an undesirable positive power supply voltage sensitivity that is hard to suppress.

A further problem that may arise for some transistors is negative power supply voltage sensitivity. This sensitivity arises when the drain of bias transistor 120 does not act as a perfect current source, so that changes in the level of the negative power supply affects the current from the drain and thereby the bias voltage.

SUMMARY OF THE INVENTION

Among others, it is an object of the invention to provide for an amplifier circuit that is less susceptible to deviations in both threshold voltage and power supply voltage.

An amplifier circuit according to claim 1 is provided. This circuit comprises an amplifier transistor fed from a first power supply connection. As in the prior art this amplifier circuit comprises a bias stage with a bias transistor having a gate coupled to a second power supply connection, a source coupled to the second power supply connection via the source resistance and a drain coupled to a reference connection (gnd) via the drain resistance and to the gate of the amplifier transistor.

The bias stage comprises a further resistance, coupled from a node between the source of the bias transistor and the source resistance to a circuit node that carries a voltage on a same side of a voltage of the second power supply connection as the first power supply connection. If the first power supply voltage is higher than the reference and the second power supply voltage is lower than the reference, the resistance is coupled to a higher voltage than the voltage at the second power supply connection. Conversely, if opposite polarities are used the resistance is coupled to a lower voltage than the voltage at the second power supply connection. The resistance may be connected to the reference or to the first power supply connection for example. In this way threshold voltage variations can be compensated without pinching off the amplifier transistor.

In an embodiment resistances coupled to both the reference or to the first power supply connection and the reference may be used in combination. This may be used to suppress gate voltage variations of the amplifier transistor due to fluctuations in the second power supply voltage, or to introduce a dependence on fluctuations in the first power supply voltage to compensate for gain variations of the amplifier transistor caused by such fluctuations.

BRIEF DESCRIPTION OF THE DRAWINGS

These and other objects and advantageous aspects of the invention will be illustrated using a description of exemplary embodiments, using the following figures.

DETAILED DESCRIPTION OF THE DRAWINGS

Figure 1:
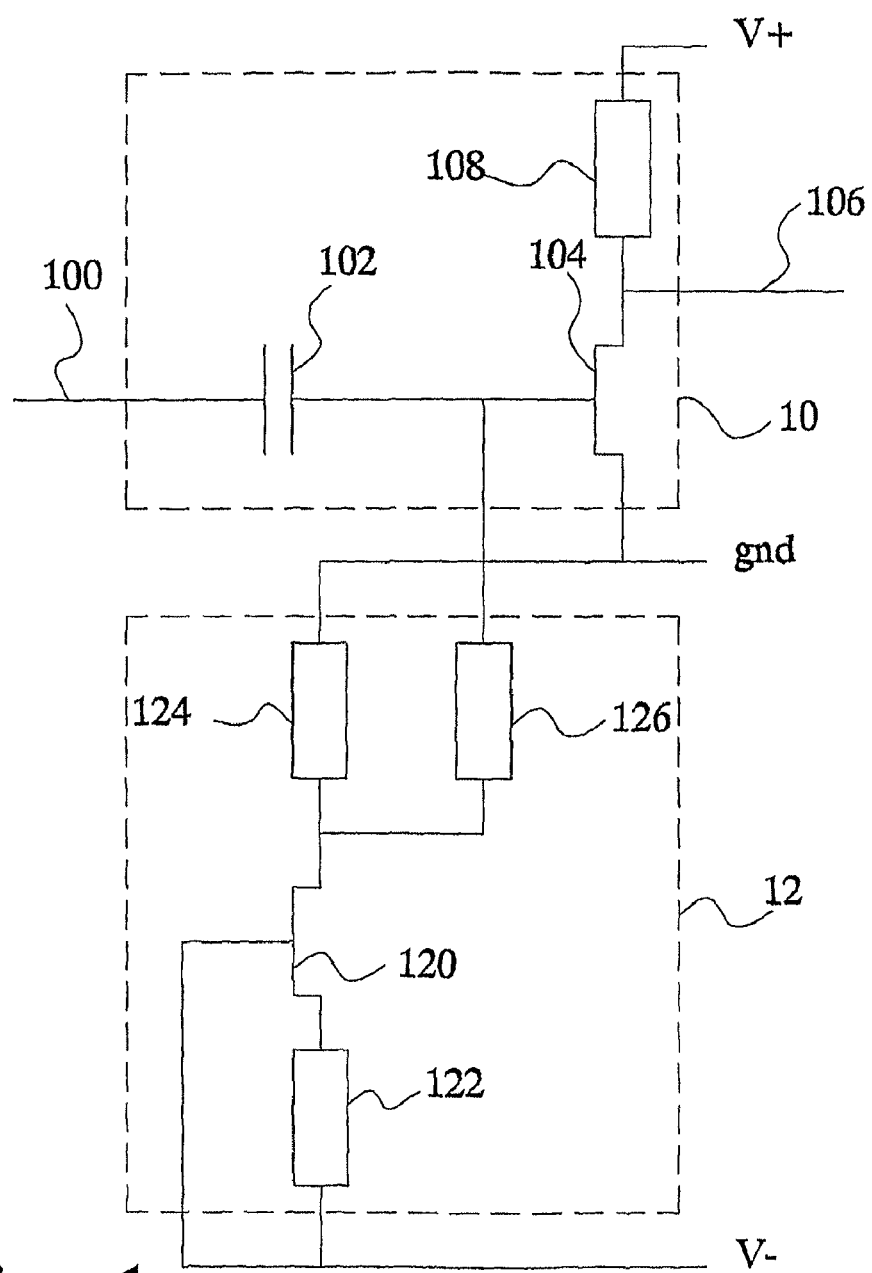
FIG. 1 shows a prior art amplifier circuit
Figure 2:
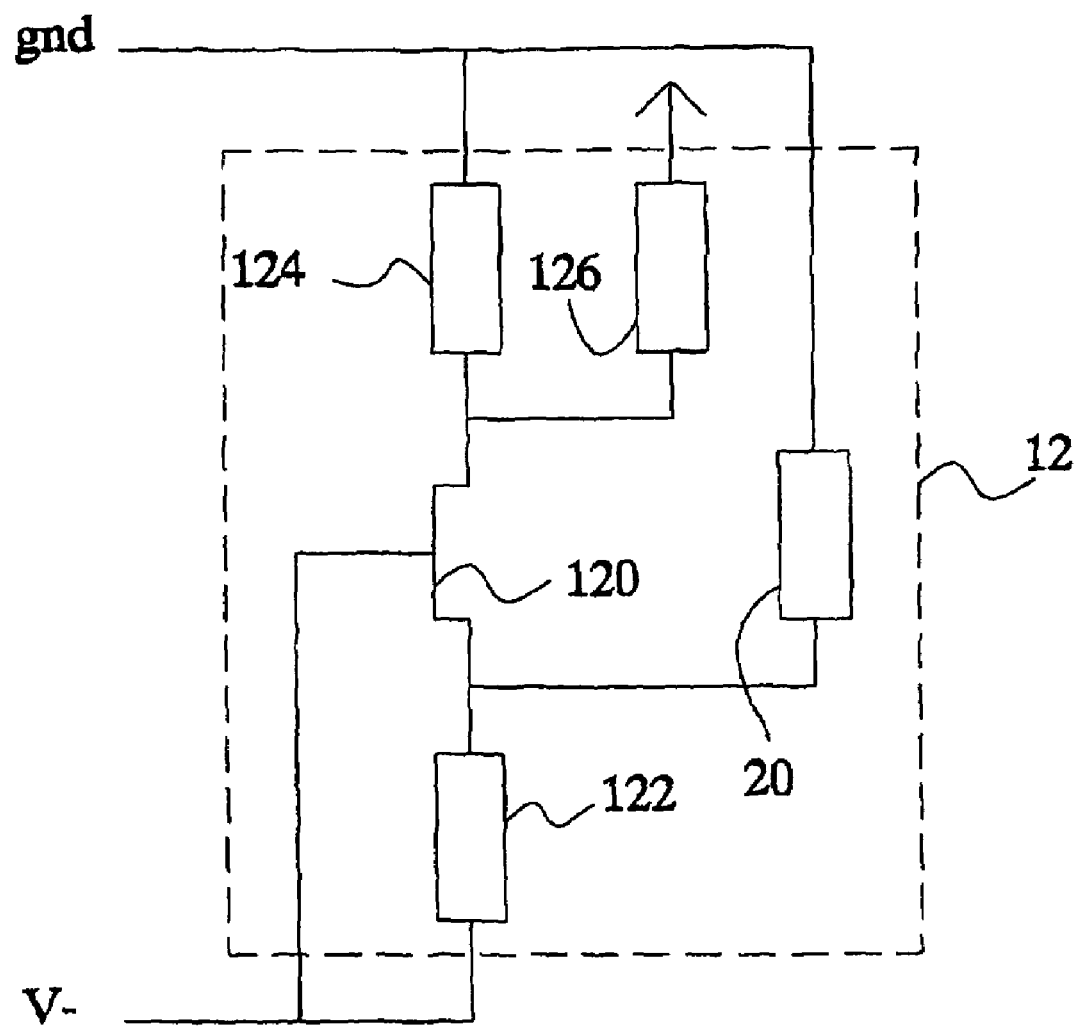
FIGS. 2, 2A shows improved bias stages

FIG. 2 shows an improved bias stage 12 as a replacement of the bias stage 12 of FIG. 1. A first resistor 20 has been added, coupled between ground and a node between the source of bias transistor 120 and source resistor 122. First resistor 20 serves to compensate for power supply deviations. In addition, as is the case for the circuit of FIG. 1 the bias stage 12 still serves to compensate for threshold voltage deviations, but without pinching off amplifying transistor 104.

The coupling of the node to gnd via first resistor 20 serves to affect an offset in the bias voltage at the gate of amplifier transistor 104 (not shown in FIG. 2). First resistor 20 may be coupled to any power supply voltage connection that supplies a higher power supply voltage than the negative power supply voltage connection V− (to gnd in the figure, but alternatively a coupling to V+ may be used). Because part of the current through source resistor 122 flows through first resistor 20, the current through drain resistor 124 is less than the current through source resistor 122, which leads to a less negative bias voltage for amplifier transistor 104.

Operation of bias stage 12 can be described by a number of equations. First of all, the threshold voltage deviation compensation is determined by setting the gain "g" of bias stage 12 to a desired value. In contrast to the circuit of FIG. 1 the dependence on the source resistor value Rs of source resistor 122 is changed. Instead of on Rs the gain "g" depends on the effective resistance Rq coupled to the source of bias transistor 120. In an approximation $g = -sRd/(1+sRq)$ Although this formula is used for demonstration purposes, it should be understood that in practice the gain may also be determined experimentally or by simulation. The effective resistance Rq corresponds to a parallel circuit of the resistors 122 and 20 to the negative power supply connection and ground respectively. The combination of these resistances, the properties of bias transistor 120 and the drain resistor 124 is selected so that a set gain is realized (preferably g=−1).

The voltage effect of connection of first resistor 20 to ground can be modelled as the addition of a virtual voltage source in series with the effective resistance Rq and with its negative terminal connected to V−. The voltage Vq of this virtual voltage source returns with a factor "−g" in the bias voltage and is used to set the absolute value of the bias voltage. The voltage Vq corresponds to the hypothetical voltage that would appear at the source of bias transistor 120 if the source current would be zero. An expression for the voltage Vq of this voltage source is $Vq = (-V-)Rs/(R20+Rs)$ The resistance values Rs and R20 (of first resistor 20) are preferably selected so that a desired offset gVq in the bias voltage is realized.

Figure 2A:
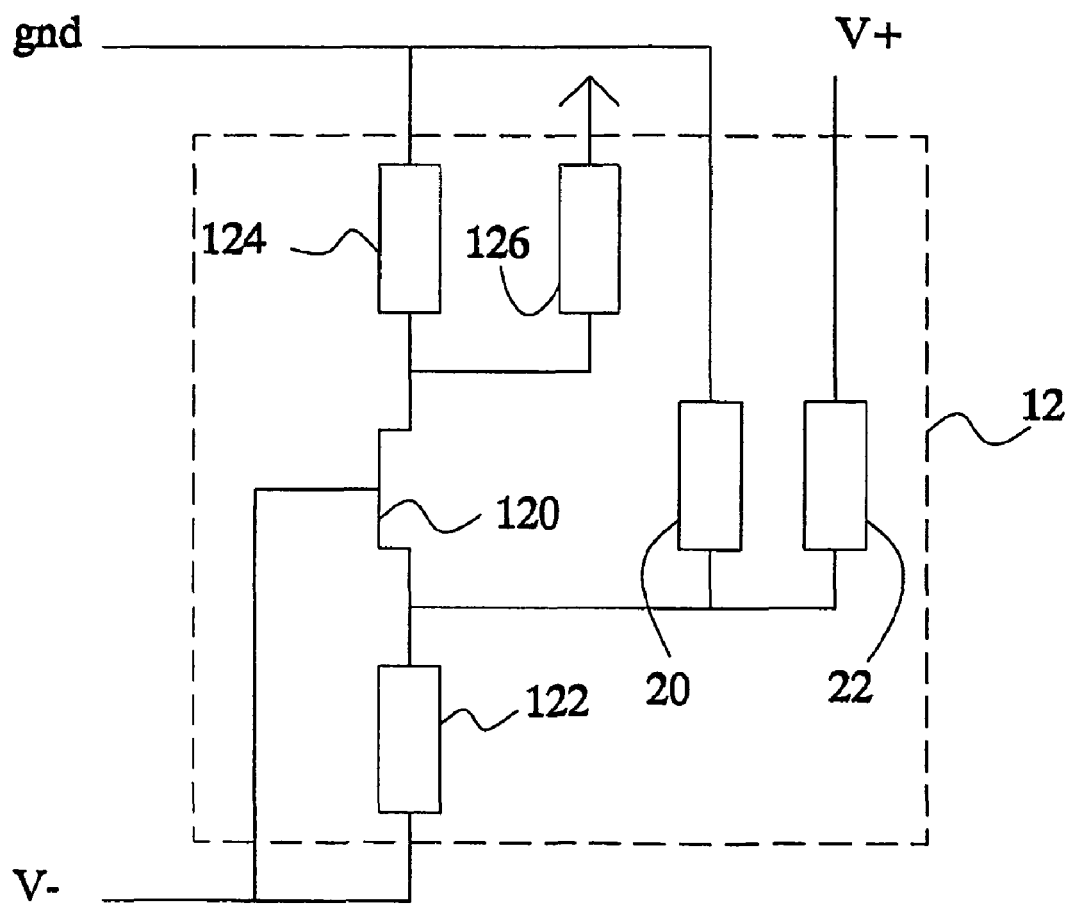

FIG. 2A shows an alternative wherein a second resistor 22 has been added, coupled between the source of bias transistor 120 and the positive power supply connection V+. This resistor has a similar effect as first resistor 20. It may be used in combination with or instead of first resistor, taking account of the fact that it changes the effective source resistance Rq (e.g. the parallel circuit of Rs, R20 and R22) and the changed voltage source voltage Vq.

The additional resistor (first resistor 20 and/or second resistor 22) may used to compensate for the effect of negative power supply voltage deviations on the bias voltage. This effect arises when bias transistor 120 does not behave as a perfect current source, i.e. when it's drain current depends on it's source drain voltage for a given gate source voltage.

A change in the negative power supply voltage affects Vq, which in turn affects the bias voltage of amplifier transistor 104 in the opposite direction compared to the imperfect current source behaviour of bias transistor 120. It may be noted that the bias stage, as described so far, is used to realize a desired gain "g" (preferably minus one) and a desired offset (approximately gVq). These effects depend on three parameters that are freely selectable within certain bounds: the resistance values of first and/or second resistor 20, 22 and the transconductance s of bias transistor 120.

It has been found that the combination of the values of these parameters can be selected so that the effect of negative power supply voltage deviations on the bias voltage of amplifier transistor 104 is compensated in combination with setting a desired gain g and offset voltage and in combination with full compensation of threshold voltage variations. The desired parameter values can be easily selected using simulation of experimentation for example by first selecting a set of parameters that realizes the required gain and offset and then making successive changes to pairs of the parameters with mutually compensating effect on the gain and offset, until a desired negative supply voltage compensation is realized.

The design freedom afforded by the bias stage of FIGS. 2, 2A can be used further to compensate for positive power supply voltage effects on the gain of the amplifier stage. It has been found that high frequency gain of some amplifier transistors 104 increases with decreasing positive power supply voltage V+. In a further embodiment this effect is compensated by lowering the gate bias of amplifier transistor 104 when the positive power supply voltage V+ decreases. This is realized by second resistor 22, which has the effect that Vq drops with decreasing positive power supply voltage V+. In turn a decreased Vq leads to a lower gate bias voltage for amplifier transistor 104.

The desired amount of lowering of the gate bias with decreasing positive power supply voltage V+ depends on properties of amplifier transistor 104. The effect of the power supply voltage V+ on the gain should be substantially equal but opposite to the effect of changed bias voltage. Given the desired power supply voltage V+ sensitivity of the bias voltage that can be derived from this the values of the first and second resistor 20, 22, the source resistor value Rs and the transconductance s of bias transistor can be selected. The desired parameter values are preferably selected using simulation of experimentation.

Although a circuit has been described wherein resistors 20, 22 to the ground and the positive power supply connection (V+) have been used, it should be appreciated that more complex resistance networks may be used instead, or that such a resistor may be connected to the ground or the positive power supply connection via some other nodes that defines a supply voltage or current, such as a node in a voltage divider circuit or a voltage reference circuit. Similarly, although the gate of bias transistor 120 has been shown coupled directly to the second power supply connection V− directly, it should be appreciated that alternatively other forms of coupling may be used, for example via some resistance circuit or another high frequency blocking circuit.

Also, although a circuit has been described wherein resistors 20, 22 are connected directly to the source of bias transistor 120, it should be appreciated that a more indirect connection may be used with the same effect. For example, instead of source resistor 122 a series arrangement of resistors may be used, in which case first resistor 20 and/or second resistor 22 may be coupled to a node inside this series arrangement. Similarly, first resistor 20 and second resistor 22 may be coupled to the source (or such a node) in common via a further resistor (not shown).

Although a circuit has been described wherein N channel transistors are used (requiring a positive drain-source voltage) it will be appreciated that transistors of the opposite conductivity type may be used if the role of the positive and negative power supply voltages is exchanged.

Furthermore, although only components have been shown that are useful for explaining operation of the circuit, it should be appreciated that in practice further components may be present, such as high frequency circuit elements to block high frequency signals from circuit parts where they are not desired etc. (High frequency, is used herein to distinguish the frequencies of the amplified signals from the (DC) supply voltages, without implying any limitation to a specific frequency band). Also, although resistors and capacitors have been shown, it should be appreciated that in practice some or all of these components may be implemented using transistors or other devices in a circuit configuration that makes them provide the same relevant circuit properties as a resistance or capacitor. In general any circuit with resistance properties, such as a resistor, a network of resistors and/or circuit elements configured to have the same relevant properties as a resistance will be termed resistance herein.

The invention claimed is:

1. An amplifier circuit, comprising:
    a reference connection and a first and second power supply connection for supplying voltages on mutually opposite sides of a voltage on the reference connection;
    an amplifier stage, comprising an amplifier transistor with a gate coupled to an input of the amplifier stage, a source coupled to the reference connection and a drain coupled to the first power supply connection; and
    a bias stage, comprising a bias transistor, a drain resistance and a source resistance, the bias transistor having a gate coupled to the second power supply connection, a source coupled to the second power supply connection via the source resistance, so that a voltage drop over the source resistance at least partly defines a gate source voltage of the bias transistor and a drain coupled to the reference connection via the drain resistance and to the gate of the amplifier transistor;
    wherein the bias stage comprises a further resistance, coupled from a circuit node carrying a voltage with a same polarity relative to the second power supply connection as the first power supply connection, to a node between the source of the bias transistor and the source resistance, for injecting current through the source resistance in addition to current originating from the drain resistance.

2. The amplifier circuit according to claim 1, wherein the further resistance is coupled to the reference connection.

3. The amplifier circuit according to claim 1, wherein the further resistance is coupled to the first power supply connection.

4. The amplifier circuit according to claim 3, comprising a second further resistance coupled to the reference connection.

5. The amplifier circuit according to claim 4, wherein resistance values of the further resistance and the second further resistance have been selected so that substantially all gate voltage variation at the gate of the amplifier transistor due to power supply voltage variation on the second power supply connection is compensated.

6. The amplifier circuit according to claim 4, wherein resistance values of the further resistance and the second further resistance have been selected so that a voltage difference between the gate of amplifier transistor and the reference connection decreases in response to increased voltage difference between the first power supply connection and the reference connection.

7. A gate bias circuit for an amplifier circuit including a first power supply connection, a second power supply connection, and a reference connection, the first power supply connection and second power supply connection supplying voltages on mutually opposite sides of a voltage of the reference connection, and an amplifier transistor with a gate coupled to an input of the amplifier circuit, a source coupled to the reference connection and a drain coupled to the first power supply connection, the gate bias circuit comprising:
    a bias transistor, a drain resistance and a source resistance, the bias transistor having a gate coupled to the second power supply connection, a source coupled to the second power supply connection via the source resistance and a drain coupled to the reference connection via the drain resistance and to the gate of the amplifier transistor;
    wherein the gate bias circuit comprises a further resistance, coupled from a node between the source of the bias transistor and the source resistance of the bias transistor to a circuit node that carries a voltage on a same side of a voltage of the second power supply connection as the first power supply connection.

* * * * *